United States Patent
Young et al.

(10) Patent No.: US 7,480,842 B1
(45) Date of Patent: Jan. 20, 2009

(54) METHOD AND APPARATUS FOR REDUCING THE NUMBER OF TEST DESIGNS FOR DEVICE TESTING

(75) Inventors: Jay T. Young, Louisville, CO (US); Ian L. McEwen, Golden, CO (US); Reto Stamm, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 739 days.

(21) Appl. No.: 10/892,603

(22) Filed: Jul. 16, 2004

(51) Int. Cl.
*G01R 31/28* (2006.01)
*G06F 11/00* (2006.01)

(52) U.S. Cl. ...................... 714/725; 714/741
(58) Field of Classification Search .......... 714/725, 714/741; 716/4; 703/14
See application file for complete search history.

(56) References Cited

U.S. PATENT DOCUMENTS

| | | | |
|---|---|---|---|
| 6,161,211 A * | 12/2000 | Southgate | 716/1 |
| 6,311,317 B1 * | 10/2001 | Khoche et al. | 716/18 |
| 7,072,814 B1 * | 7/2006 | Stoica | 703/13 |
| 7,293,257 B2 * | 11/2007 | Czerwonka | 717/124 |
| 7,299,430 B1 * | 11/2007 | McEwen et al. | 716/4 |
| 7,302,624 B2 * | 11/2007 | Rajski et al. | 714/732 |
| 2005/0081109 A1 * | 4/2005 | Czerwonka | 714/38 |
| 2006/0010428 A1 * | 1/2006 | Rushby et al. | 717/124 |

OTHER PUBLICATIONS

Kelem et al., "Shortening the Design Cycle for Programmable Logic Devices," IEEE Devices & Test of Computers, Dec. 1992, pp. 40-50.*
U.S. Appl. No. 10/683,944, filed Oct. 10, 2003, Young.

* cited by examiner

*Primary Examiner*—Cynthia Britt
(74) *Attorney, Agent, or Firm*—Timothy W. Markison; Robert M. Brush

(57) ABSTRACT

The present invention includes an apparatus and method to optimize a set of test designs to obtain complete coverage while reducing bit stream size for programmable fabric. Test designs are selected that do not result in lost coverage. The method selects a set of test designs, removes the set of test designs, and then determines if coverage is lost. If coverage is lost, the method creates a new set of test designs to test the lost coverage. If the new set of test designs is smaller than the removed set, the new set of test designs is added to the test design suite; otherwise the removed test designs are added back to the test design suite. The decision to add the new test designs or removed test designs is based on a number of criteria including evaluating the number of uniquely tested resources in each test design.

9 Claims, 10 Drawing Sheets simple implementation for test design optimization integrated circuit 10 programmable and fixed logic
device test typical FPGA architecture test design removal test logic design system 24 simple implementation for test design optimization fast implementation for test design optimization method for developing test designs that test routes an resources within programmable fabric method for developing test designs that test routes and resources within programmable fabric

METHOD AND APPARATUS FOR REDUCING THE NUMBER OF TEST DESIGNS FOR DEVICE TESTING

BACKGROUND OF THE INVENTION

1. Field of the Invention

This invention relates generally to integrated circuits and more particularly to testing of integrated circuits.

2. Description of Related Art

Integrated circuit devices include millions of components and logic devices for executing particular functions. Such functions include data processing, signal manipulation, communications, etc. Additionally, demands are being made for flexible architectures that operate at throughput rates and efficiencies heretofore only realized by application specific integrated circuit designs. Such flexible architectures typically include a combination of programmable logic, fixed logic, and software driven processor based logic.

Such new systems, however, are very complex and require complex testing plans. Moreover, the increased throughput demands are pushing some current integrated circuit manufacturing processes to their operating limits. Integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high throughput integrated circuit may operate without excessive jitter performance or phase noise performance.

Modern integrated circuit systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits-per-second for OC48, to 9.95 gigabits-per-second for OC192. Other known standards define data rates of 2.5 gigabits-per-second (INFINIBAND) or 3.125 gigabits-per-second (XAUI). For example, one protocol may specify a peak voltage range of 200-400 millivolts, while another standard specifies a mutually exclusive voltage range of 500-700 millivolts. Thus, a designer either cannot satisfy these mutually exclusive requirements (and therefore cannot support multiple protocols) or must design a high data rate transceiver device that can adapt according to the protocol being used for the communications.

Along these lines, programmable logic devices, and more particularly, field programmable gate array (FPGA) circuits are gaining in popularity for providing the required flexibility and adaptable performance, as described above, for those designers who seek to build one device that can operate according to multiple configurations. For example, parallel interface buses such as Peripheral Component Interface (PCI) and the newer high-speed PCI (PCI-X) may be programmed for a computer interface while high-speed serial I/O may be programmed to be compatible with 3G-IO, InfiniBand, or Rapid IO. Thus, while FPGA technology affords a designer an opportunity to develop flexible and configurable hardware circuits, the opportunity has come with increasingly complex designs that increase the cost of production testing.

Testing every functional logic device and every routing resource within the FPGA or other dense logic device requires a large number of test designs that further require long sequences of test bit streams that are clocked into the FPGA or dense logic device. This leads to increased testing time and costs. There is a need, therefore, for a method and apparatus to reduce the number of test designs in a manner that will reduce the overall test bit stream programming time and, therefore, the cost of testing.

BRIEF SUMMARY OF THE INVENTION

A method and an apparatus of the present invention develop and optimize a suite of test designs to test routing resources in a programmable fabric. The method includes developing a set of test designs to test every routing resource within the programmable fabric.

The method selects at least one test from the test design suite for removal, removes the at least one test and determines if a routing resource is left untested. If a resource is left untested, the method adds a test design to test the uncovered resource. Adding a test design back to the test design suite typically includes adding a new test to test not only the untested resource but also to test a lightly covered resource or may add the removed test design back to the test design suite. The decision to add a new test design or add the removed test design back to the test design suite is based on a number of criteria which may include evaluating a number of routing resources tested in each test design. One of average skill in the art will recognize that a routing resource is any structure encountered in a test design route from a source to a destination, and includes the routing segments (wires) and transistors coupling two points together. The suite of test designs may also test other resources of the programmable fabric. A test design is selected for removal based on the number of routing resources (used or tested) in the test design that is less than a specified number. In one embodiment the specified number is twelve. The method sequences through each test design in the test design suite then repeats the process until the test design suite is optimized.

For test design suites with a large number of test designs, sequencing through each test design can be time consuming. An alternate method selects a group of test designs for removal based on the number of routing resources tested in each test design. This is advantageous when many test designs test a limited number of resources, thus the number of routing resources uniquely tested in each test design is low. One embodiment selects the group of test designs when the number of routing resources uniquely tested is less than or equal to 12.

The method optimizes the test design suite so that a smaller number of test designs fully test every route and routing resource within the programmable fabric. The method further balances the test design suite by selecting routes so that each resource is tested by a substantially equal number of test designs. This balancing increases the probability that a number of test designs can be removed resulting in the combined test design bit stream size being reduced. Some estimates place the cost of programming the test bit stream at 80-90% of the cost of testing the programmable fabric. A reduction in the size of the bit stream directly reduces the cost of testing. Thus, a reduction in the number of test designs that results in a smaller test design bit stream size generally has a direct reduction on the cost of testing the programmable fabric.

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will

DETAILED DESCRIPTION OF THE INVENTION

Figure 1:
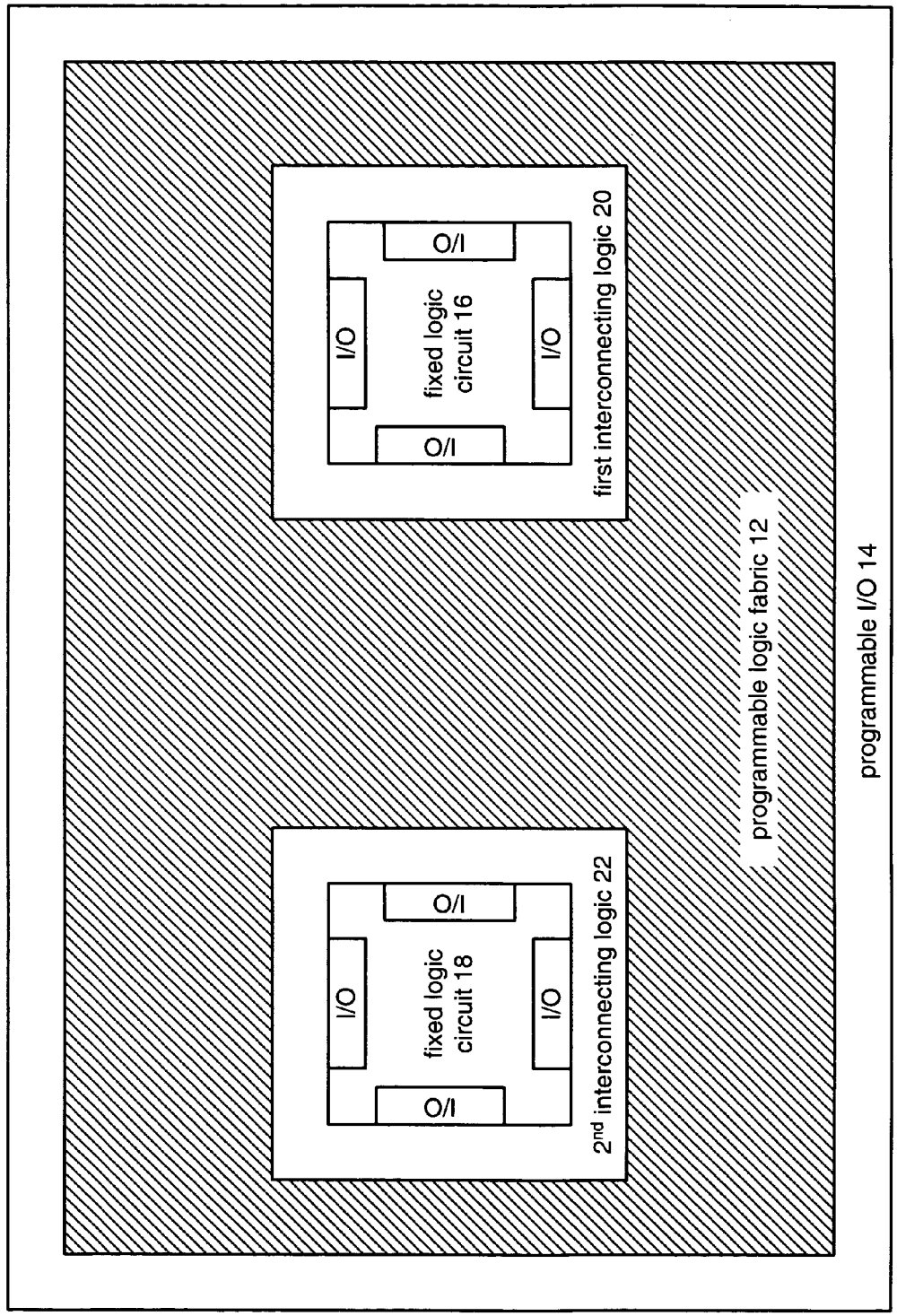
FIG. 1 is a functional block diagram of a programmable logic device that includes a programmable logic fabric, programmable input/output circuitry for coupling the programmable logic fabric with external circuitry, and a pair of fixed logic circuits within the programmable logic fabric.

FIG. 1 is a functional block diagram of an integrated circuit 10 that includes programmable logic fabric 12, programmable input/output circuitry 14 for coupling programmable logic fabric 12 with external circuitry, and a pair of fixed logic circuits 16 and 18 within programmable logic fabric 12. The integrated circuit 10 may be a programmable logic device, such as a programmable logic array device, a programmable array logic device, an erasable programmable logic device, and/or a field programmable gate array (FPGA). When the integrated circuit 10 comprises an FPGA, the programmable logic fabric 12 may be implemented, for example, as a symmetric array configuration, a row-based configuration, a sea-of-gates configuration, and/or a hierarchical programmable logic device configuration. The programmable logic fabric 12 may further include other resources, such as at least one dedicated fixed processor (e.g., a microprocessor core), memory, adders, multipliers, transceivers, multi-gigabit transceivers, DSP blocks, to further facilitate the programmable flexibility offered by integrated circuit 10.

Fixed logic circuits 16 and 18, in the described embodiment, each contain a plurality of I/O ports (four are shown though any number may be included according to design choice). Fixed logic circuit 16 communicates with programmable logic fabric 12 by way of first interconnecting logic 20. Fixed logic circuit 18 communicates with programmable logic fabric 12 by way of second interconnecting logic 22.

Generally, one important aspect and part of designing complex systems such as that shown in FIG. 1 includes testing the fixed logic circuits 16 and 18, I/O circuitry and the programmable I/O 14 as well as the programmable logic fabric 12 and routing resources within such systems. Many different test algorithms and test designs must be made to accomplish testing of such circuitry in an efficient manner. Current test methodologies attempt to test every route and or resource in the programmable fabric. While only one test design may be needed to test a specified route through the programmable fabric, routing resources in the specified route are typically tested repeatedly by test designs for alternate routes through the programmable fabric. Thus, redundant test designs that repetitively test previously tested resources represent an unnecessary cost to production testing. Test design generation includes generating the initial test design suite and generating additional test designs or modifying existing test designs during optimization. A test design generator produces a test design or a suite of test designs based on a set of routing resources that have not been tested. A test design generating algorithm may include a frequency of coverage (the number of times a routing resource is tested) concept wherein a test design is generated to test a set of untested routing resources or lightly tested routing resources to get a substantially balanced frequency of coverage for all the routing resources. Typically, a goal of testing is ensuring that every resource is tested at least once to detect possible failure.

The initial test design suite that tests every routing resource is then optimized so that a smaller number of test designs fully test every routing resource. Test designs are removed from the suite based on how much lost coverage (e.g., resources that become untested) is encountered after a test design is removed. The removed test designs may be added back to the design suite or new test designs may be generated to cover untested routing resources.

Figure 2:
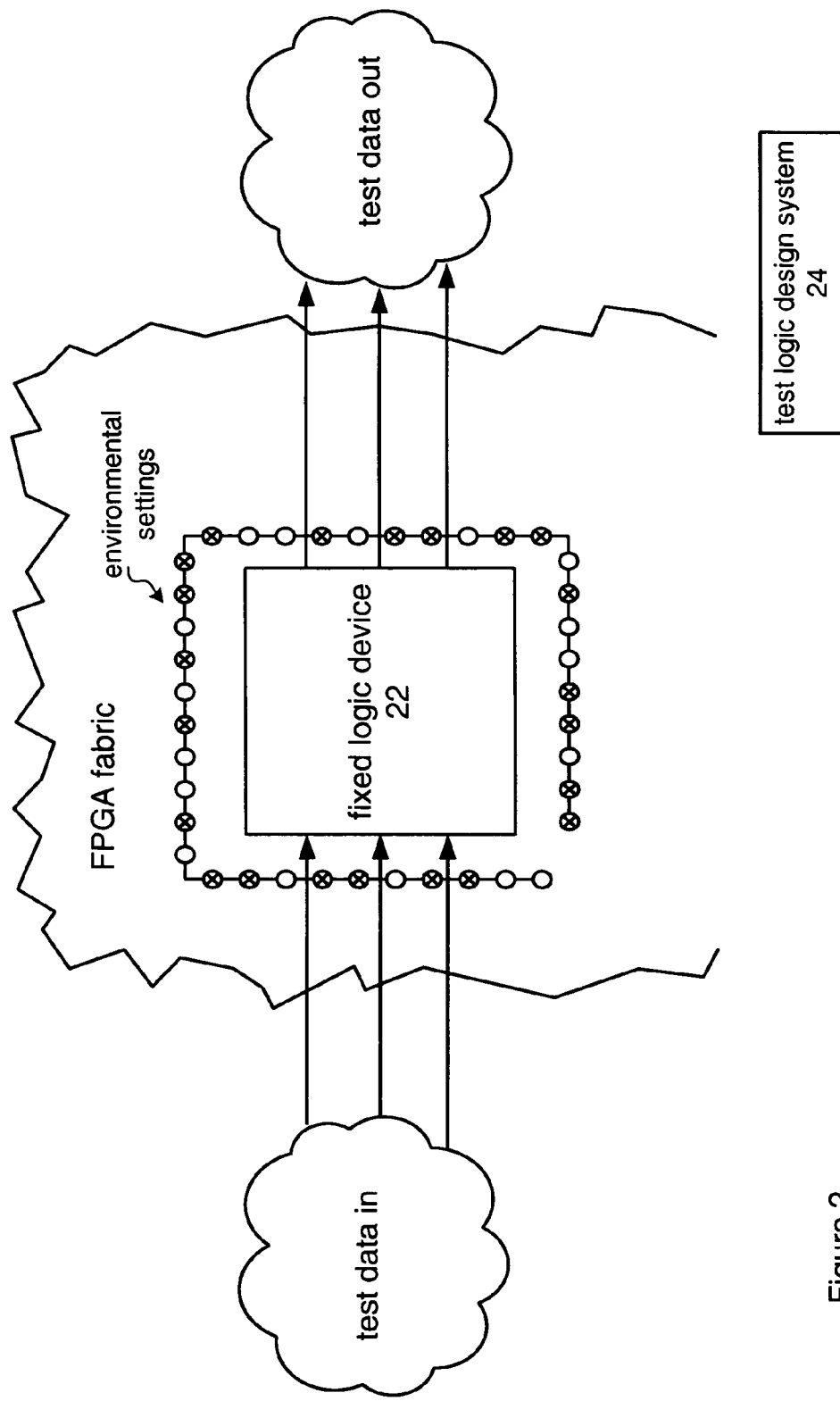
FIG. 2 is a functional block diagram illustrating one aspect of testing a fixed logic device.

FIG. 2 is a functional block diagram illustrating one aspect of testing a fixed logic device. In FIG. 2, a fixed logic device 22 is embedded in programmable fabric (here, field programmable gate array), which fabric is used to establish electrical environmental settings for specified pins of fixed logic device 22 and to conduct test data in and out of fixed logic device 22. Thus, as may be seen, for some test procedures, testing is an involved process requiring significant preparation and support. For example, for each data bit that is input into fixed logic device 22, one or more surrounding pins may require setting into a specified state for proper testing purposes. Moreover, one or more pins may require coupling to an external tester or to logic to evaluate a response of fixed logic device 22. While FIG. 2 suggests that fixed logic device is a complex device, such test considerations are equally legitimate for much smaller logic devices requiring test. As may be seen, a test logic design system is operable to develop test designs for at least a portion of the logic that is to be tested. In the example of FIG. 2, test logic design system 24 generates test designs for setting the environmental settings in relation to test data that is input. Generally, the environmental settings as well as the test data that is pumped into a logic device form a test bit stream. It is preferable to reduce the magnitude and quantity of test bit streams in order to minimize total test time. Accordingly, reducing test designs, test patterns, and test steps all generally involve reducing or minimizing test bit streams. Such terminology may be used synonymously for the purposes of the present application.

Figure 3:
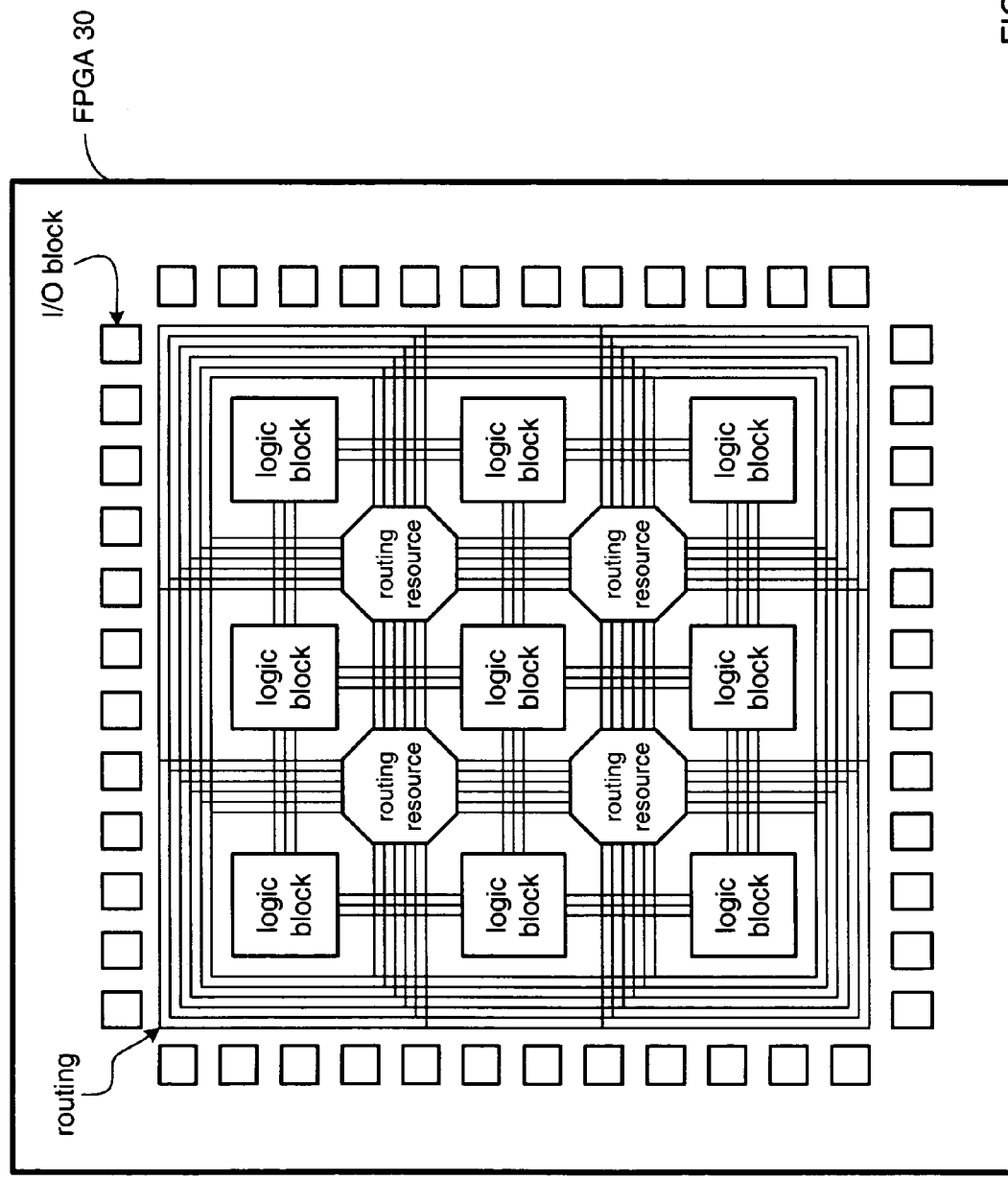
FIG. 3 illustrates typical field programmable logic array (FPGA) architecture.

FIG. 3 is a typical FPGA architecture according to one embodiment of the invention. As may be seen, a plurality of logic blocks is surrounded by routing resources. Moreover, a plurality of I/O blocks within an FPGA 30 provides I/O capability to enable one or more of the logic blocks to communicate with external devices. Each logic block requires testing from an external perspective for specified responses for specified inputs. Moreover, within each logic block, additional logic may require testing, and other resources within an FPGA may need testing. The routing resources, and all possible routes through those resources, may also require testing. For all of the test procedures that are developed, one important aspect is to minimize duplicative tests and to maximize test efficiency by minimizing test patterns that are developed and kept for testing as well as minimizing the number of signals required to be produced and propagated through the devices under test and, more specifically, the circuits therein. More specifically, FIG. 3 illustrates typical field programmable gate array (FPGA) architecture. One of average skill in the art will recognize FPGA 30 is greatly simplified for the purposes of discussion and is, of course, not to scale, but does illustrate the functional architecture of a typical FPGA. Furthermore, FIG. 3 illustrates the complexity of testing every routing resource in a typical FPGA or other programmable logic device. An alternative FPGA architecture is described in U.S. patent application Ser. No. 10/683,944, entitled "Columnar Architecture" by Young, filed on Oct. 10, 2003, which is incorporated herein in its entirety. In general, methods described herein may be applied to a wide variety of integrated circuits.

As can be seen, FPGA 30 comprises a two-dimensional array of configurable logic blocks (CLBs), routing resources, input/output (I/O) blocks, and horizontal routing and vertical routing. Each CLB comprises uncommitted logic resources that are user programmable. The CLBs are typically divided into a number of logic blocks that are operably coupled to create complex logic circuits through the programming of appropriate routing resources. A single FPGA may include thousands of CLBs that may be functionally equivalent to hundreds of thousands of logic gates or more. One of average skill in the art will appreciate the complexity of the routing necessary to interconnect the CLBS.

A plurality of Static Random Access Memory (SRAM) controlled programmable switches (not shown) may interconnect the horizontal and vertical routing and connect the horizontal and vertical routing to the CLBs and to the I/O blocks. The SRAM switches further function to control the select lines of multiplexer inputs (not shown) to the logic blocks. The horizontal and vertical routing comprises both short segments and long segments. The short routing segments typically span a few CLBS, while long routing segments may span the entire FPGA. The I/O blocks are user programmable and can be configurable to support various transmission standards and bus interfaces.

The goal of completely testing every routing resource in the FPGA is made more difficult due to the variable configuration of the FPGA. Testing of the routing resources in the FPGA is separate from the verification of the digital logic functions and seeks to verify there are no shorts or opens across the routing resources and further verifies the resources are free of faults that are tied-high or that are tied-low. One method of verifying there are no shorts across the routing resources is to place a logical one on the input then clock the logical one through the routing resources to the output. This "walking one" will arrive at the output after a specified number of clock cycles unless a routing resource is shorted or tied-low. Similarly, a tied-high or stuck-at-one fault is tested by a "walking zero" test. Other tests are known to those of skill in the art.

Figure 4:
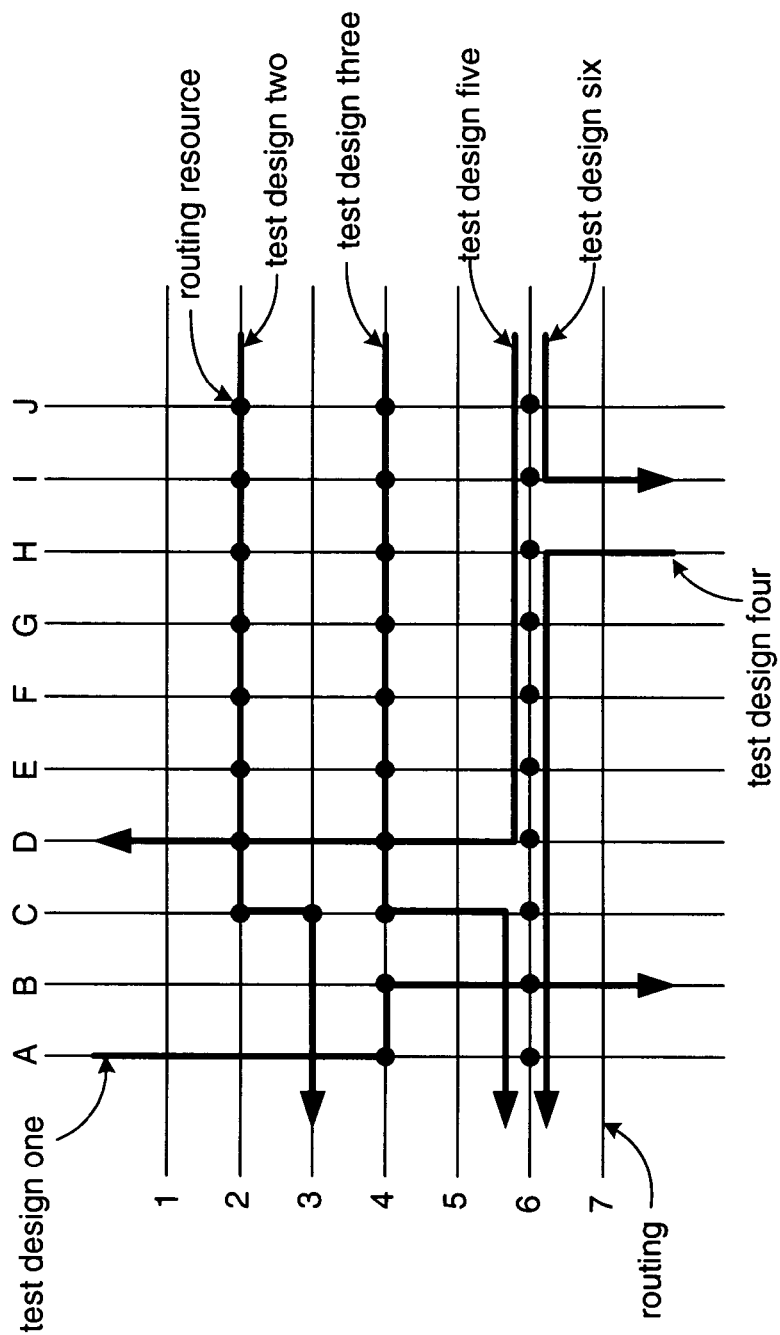
FIG. 4 illustrates a method for selecting test designs for removal from a test design suite.

FIG. 4 illustrates a method for selecting test designs for removal from a test design suite. The horizontal and vertical routing segments are connected by a plurality of routing resources (indicated by dots in the figure). For the purposes of discussion, vertical routing segments are labeled A through J and horizontal routing segments are labeled 1 through 7. In the example of FIG. 4, six test designs have been created to test the routing resources. These test designs illustrate an unbalanced or non-optimized design wherein one test design (test design six) covers only two routing resources while another test design (test design three) covers eleven routing resources.

One aspect of the present invention is to optimize the number of times that each resource is tested such that each routing resource is tested substantially the same number of times. Test designs are removed from the test design suite based on how much lost coverage will be encountered. The removed test designs may be added back to the test design suite or new test designs may be generated to replace the lost coverage. This optimization increases the probability of reducing the number of test designs.

One method of the present invention is to select a test design or a group of test designs for removal that contain a low amount of unique coverage. After at least one selected test design is removed, the routing resources are checked to see if any routing resource is left untested. Untested routing resources are then covered by adding a new test design or adding at least one removed test design back into the test design suite. This process is repeated until the entire test design suite has been evaluated and a substantially minimal test design suite is achieved.

In the example of FIG. 4, removing test design one, two or three leaves some routing resources untested. However, test designs four, five, and six repeat testing of some routing resources so these test designs are candidates for removal, since at least one of them can be removed without uncovering a routing resource (e.g., leaving a routing resource untested). For example, removing test design five leaves all routing resources tested, but removing both test design five and test design six leaves routing resources I-6 and J-6 uncovered or untested. If, however, both test design four and test design six are removed, all routing resources are still tested and the number of tests in the test suite has been reduced by two.

The example of FIG. 4 is overly simplistic for the purposes of discussion whereas a typical programmable logic device has hundreds or thousands of test designs. The test designs are evaluated according to a number of criteria, including the number of resources tested in each test design, the number of designs that test each routing resource), and an adequately fast route through the routing resources based on the intended test design clock rate wherein an adequately fast route is one that satisfies design requirements.

Because of the tiled architecture of many programmable logic devices, routing resources in the center of the device tend to be heavily tested, while routing resources on the edge of the device may be untested or only tested a few times. Another aspect of the present invention is to remove some of the test designs that primarily cover the highly tested areas and add test designs to test the resources in the lightly tested or untested resources. By reaching this more balanced test coverage, the probability of being able to remove a test design increases. One of average skill in the art should recognize the test designs of FIG. 4 are simplistic for clarity, and that a graph of real-world test designs may appear as a somewhat random configuration.

Figure 5:
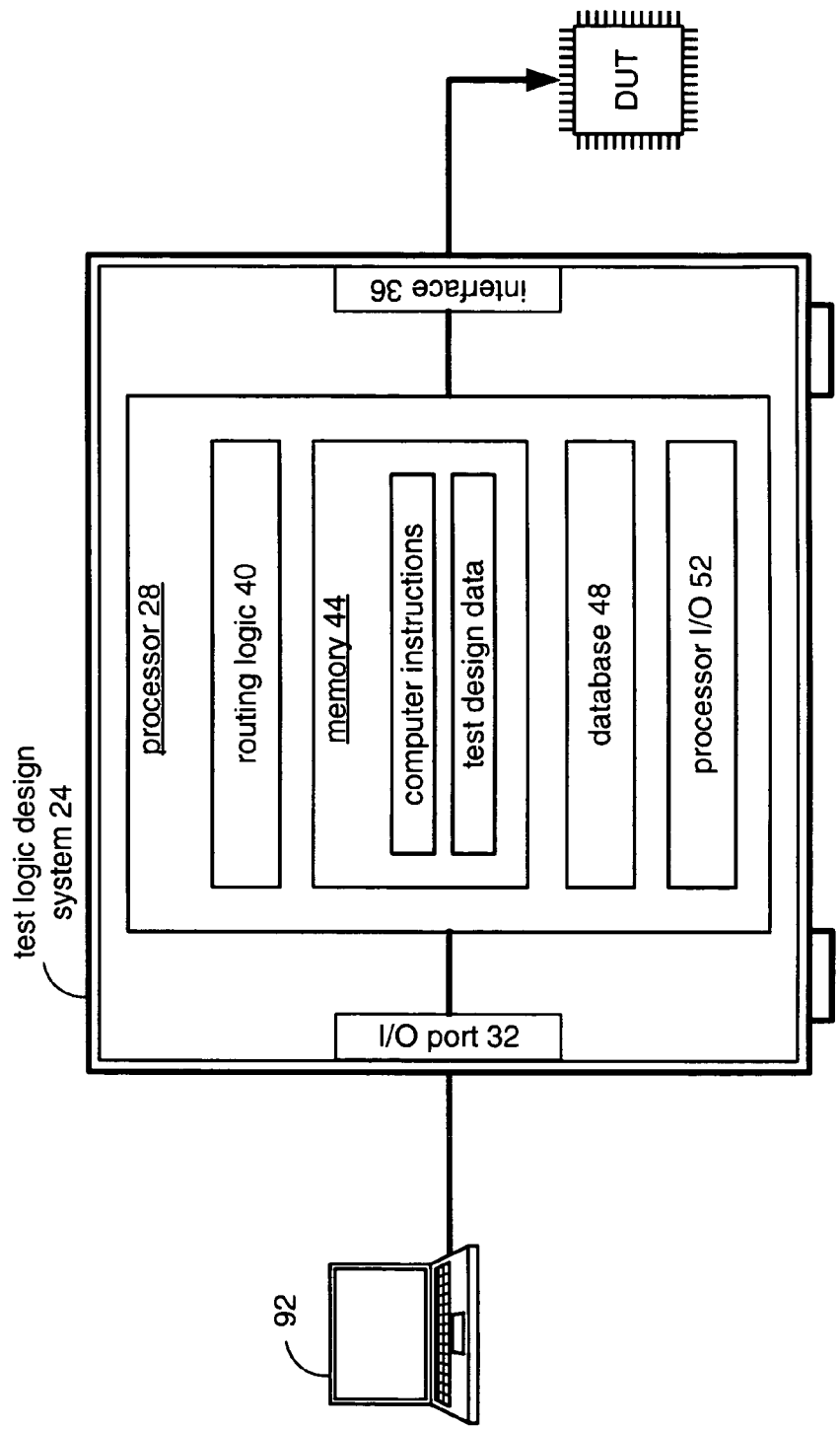
FIG. 5 is a functional block diagram of a test logic design system for developing and tests of routing and logic resources within the programmable fabric of a programmable logic device (PLD)

FIG. 5 is a functional block diagram of a test logic design system for developing tests of routing, logic, and other resources within an integrated circuit such as the programmable fabric of a programmable logic device (PLD). Test logic design system 24 includes a processor 28 for processing test designs according to the present invention disclosed herein, an input/output (I/O) port 32 and an interface 36 for transmitting test designs to test a device under test (DUT). In some embodiments, interface 36 may include storage and a tester (not shown), and test designs generated by test logic design system 24 may be stored in the storage and then delivered to a device under test by the tester.

Processor 28 further includes routing logic 40, a memory 44, a database 48, and a processor I/O 52. Routing logic 40 tests routes within the programmable fabric and selects test designs for removal. For each test design in the test design suite, routing logic 40 evaluates each routing resource and the test design coverage for that routing resource and selects test designs for removal based on the number of routing resources left uncovered if the test design is removed and on a specified number of resources tested in the test design. If any routing resource is left untested after removing a test, routing logic 40 either adds a new test to cover the untested routing resource or adds the removed test back to the test design suite. For multiple test designs that leave the same resource untested, routing logic 40 removes the test designs requiring the largest test bit streams. One aspect of the present invention is to reduce the number of test designs in a manner that will reduce the overall test bit stream programming which reduces the cost of the test.

Another aspect of the inventive method is to balance the number of times each routing resource is tested, thereby increasing the probability that test designs can be removed. Routing logic 40 generates test designs that adjust the resource frequency of coverage for resources whose frequency of coverage deviates from a specified coverage by a specified amount. In one embodiment, the specified frequency of coverage is 10 and the specified amount is five. Stated differently, routing logic 40 removes test designs that cover highly tested routing resources and adds test designs that cover untested or lightly tested routing resources. Reducing the number of routing resources each test design covers may reduce the size of the test bit stream which, as previously mentioned, reduces the programming time and the cost of testing.

Memory 44 stores computer instructions that define the operation of test logic design system 24 and further includes computer instructions that define the routing algorithm disclosed herein. Memory 44 is used as temporary storage for test design algorithms generated by routing logic 40 and further stores test design data retrieved from database 48 by processor 28 such as the test design under review and the routing resources covered by the test design. Database 48 keeps information relating to every routing resource, each test design, the total number of test designs, and further includes data on how many test designs test each routing resource. Processor 28 updates the information stored in database 48 every time a test design is added or removed from the test design suite. Processor input/output (I/O) 52 controls data flow into test logic design system 24 from I/O port 32 and controls data flow out of test logic design system 24 through interface 36.

Test logic design system 24 more generally illustrates an apparatus that operates according to the described invention to provide a balanced test design suite for programmable logic devices such as FPGAs, Complex PLDs (CPLDs), and application specific integrated circuits (ASICs). The balanced test design suite provides a fully tested programmable logic device while substantially reducing the cost to test the device. While test logic design system 24 is shown as a processor based device, it is understood that processor 28 may also be made with ASIC and FPGA technology, among others.

Figure 6:
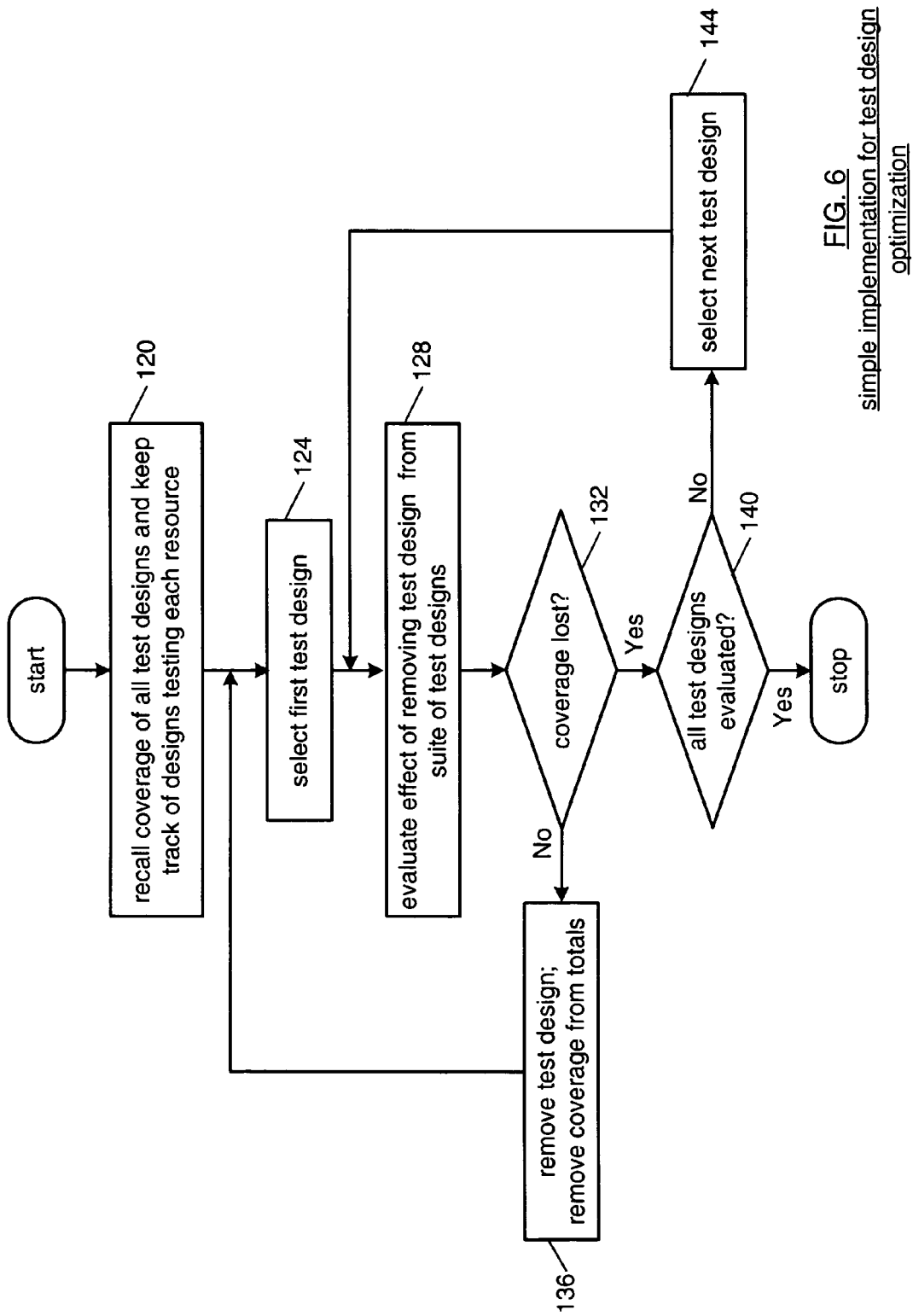
FIG. 6 is a flowchart illustrating a procedure for a simple implementation of test design optimization.

FIG. 6 is a flowchart illustrating a procedure for a simple implementation of test design optimization. This optimization procedure is an example of a procedure used by test logic design system 24 of FIG. 5 to optimize the test design suite.

The test logic design system recalls coverage of all test designs and keeps track of all test designs testing each resource (step 120). This information may be maintained in the database (database 48 of FIG. 5) and stored in memory (memory 44 of FIG. 5). Note that in some embodiments, the database itself may be stored in the memory. Keeping track of the test designs may include, for example, keeping a count of the test designs that cover each resource to be tested. The test logic design system selects the first test design (step 124), and then determines the effect of removing the test design from the suite of test designs (step 128). In a simple implementation, the procedure only looks for routing resources that become uncovered or untested (step 132) by the removal of the test design. If no coverage is lost then the test design is removed from the test design suite and the coverage is updated in the database and removed from the totals (step 136). From this step the procedure loops back to restart the process with the first test design. The procedure restarts because, potentially, no resources are left untested after a test design is removed. Test designs that leave no resources untested after removal are generally the ones that were developed very early in the design process, and later-generated test designs will often use and re-test the same resources. However, removing all of these test designs simultaneously may lead to less than full coverage. The reason for this is that the procedure generates information about the removal of each test design independently, and removal of more than one test design may result in loss of coverage. For example, if a given resource is only tested in two designs, then each of these designs could be removed independently without affecting coverage. However, removing both test designs results in loss of coverage on the given resource that is only covered by these two test designs.

If coverage is lost, then the test design is kept in the test design suite and the procedure determines if all test designs have been evaluated (step 140). If all test designs have not been evaluated, the next test in the test design suite is selected (step 144). Thereafter, the procedure repeats the evaluation process until there are no test designs that can be removed without losing coverage.

This procedure is a simple implementation of optimization in that it only tests for uncovered or untested resources.

Figure 7:
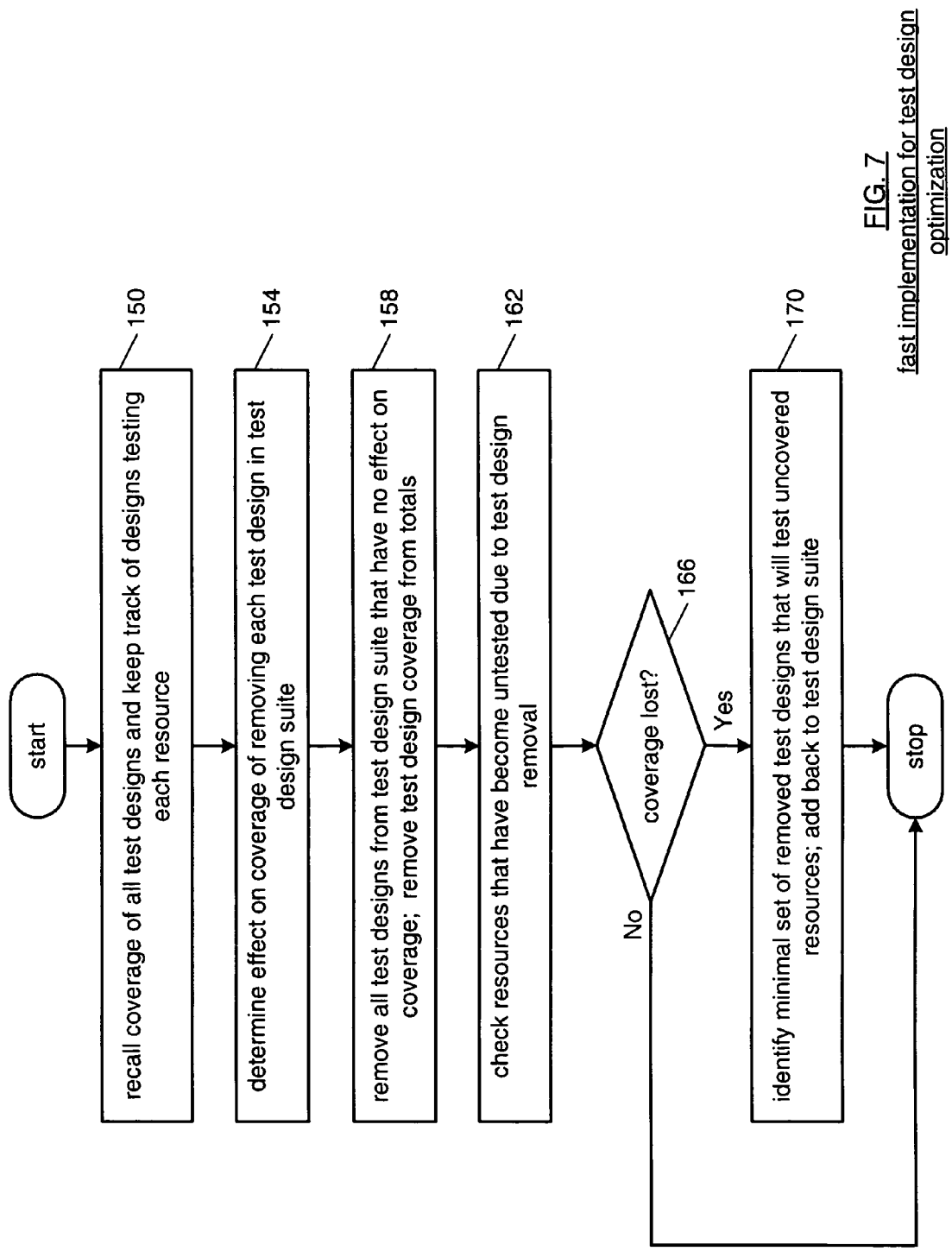
FIG. 7 is a flowchart illustrating a procedure for a fast implementation of test design optimization.

FIG. 7 is a flowchart illustrating a procedure for a fast implementation of test design optimization. This procedure is a fast implementation because it only evaluates the test design suite once, i.e., there is no iterative process. The procedure recalls coverage information of all test designs and keeps track of all designs testing each resource (step 150). The procedure then determines the effect on coverage of removing each test design in the test design suite (step 154). Thereafter, all test designs that have no effect on coverage are removed from the test design suite and the test designs are removed from coverage totals (step 158). This step differs from the simple implementation of FIG. 6 in that all unnecessary designs are removed at once. As was mentioned with respect to FIG. 6, a number of test designs may show coverage on a given resource; therefore removing one such test design does not leave the resource uncovered. However, removing multiple test designs may leave the resource untested. Accordingly, the procedure checks for resources that may have become untested due to test design removal (step 162). If coverage is lost (step 166), e.g., resources have become untested, the procedure identifies a minimal set of removed test designs that will test all the uncovered resources and adds them back into the test design suite (step 170) and the procedure stops.

This procedure is a fast implementation because there is no iterative process and no new test designs are generated, thus the original test bit streams can be reused.

Figure 8:
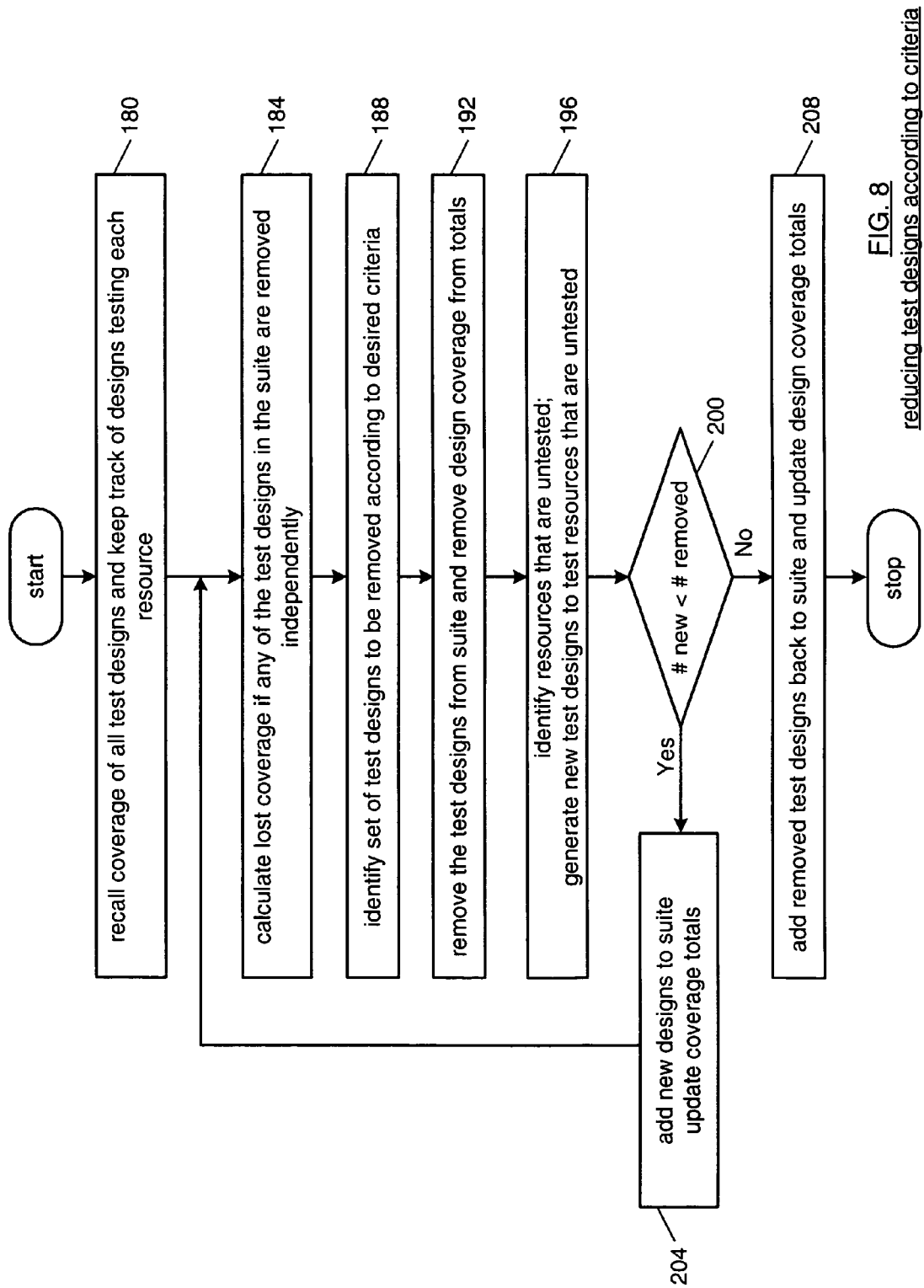
FIG. 8 is a flowchart illustrating a procedure for reducing the number of test designs in the test design suite.

FIG. 8 is a flowchart illustrating a procedure for reducing the number of test designs in the test design suite. This procedure removes test designs that have a low amount of unique coverage based on certain criteria. For example, test design removal criteria may call for removal of test designs that have a low frequency of use, have a low number of resources tested, or provide a small amount of unique coverage. The procedure first recalls coverage of all test designs and keeps track of test designs testing each resource (step 180). Thereafter, the procedure calculates lost coverage if any test designs in the test design suite are removed independently (step 184). Next, the procedure identifies a set of test designs according to desired criteria (step 188) as previously mentioned. Thereafter, the test designs are removed from the test design suite and the test design coverage is removed from the totals (step 192), for example by updating a database.

As mentioned previously, removing a set of test designs that independently show no loss of coverage may result in lost coverage when that entire set of test designs is removed. The procedure identifies resources that become untested and generates new test designs to test those untested resources (step 196). One aspect of this procedure is to reduce the number of test designs in the test design suite, so the procedure checks if the number of newly generated test designs is less than the number of test designs removed (step 200). If the number of new test designs is less than the number removed then the new test designs are added to the test design suite and the coverage totals are updated (step 204). Thereafter the procedure retests the new suite of test designs. If the number of new test designs is equal to or greater than the number of test designs removed, then the procedure adds the previously removed test designs back to the test design suite and updates the design coverage totals (step 208). Thereafter the procedure stops. Although not shown in FIG. 8, an iterative process may be implemented wherein the desired criteria are incrementally changed after each iteration until the procedure has reached a minimal solution.

It should be noted that a reduced number of test designs may not always map to a reduced bit stream. That is, reducing the number of test designs may not always lead to reduced test time and cost, which are the ultimate goals. In the context of the described embodiment of the present invention, "a reduced number of test designs" implies a reduced bit stream (and therefore reduced testing time and cost) as well, which is generally the case when the number of designs is reduced.

Figure 9:
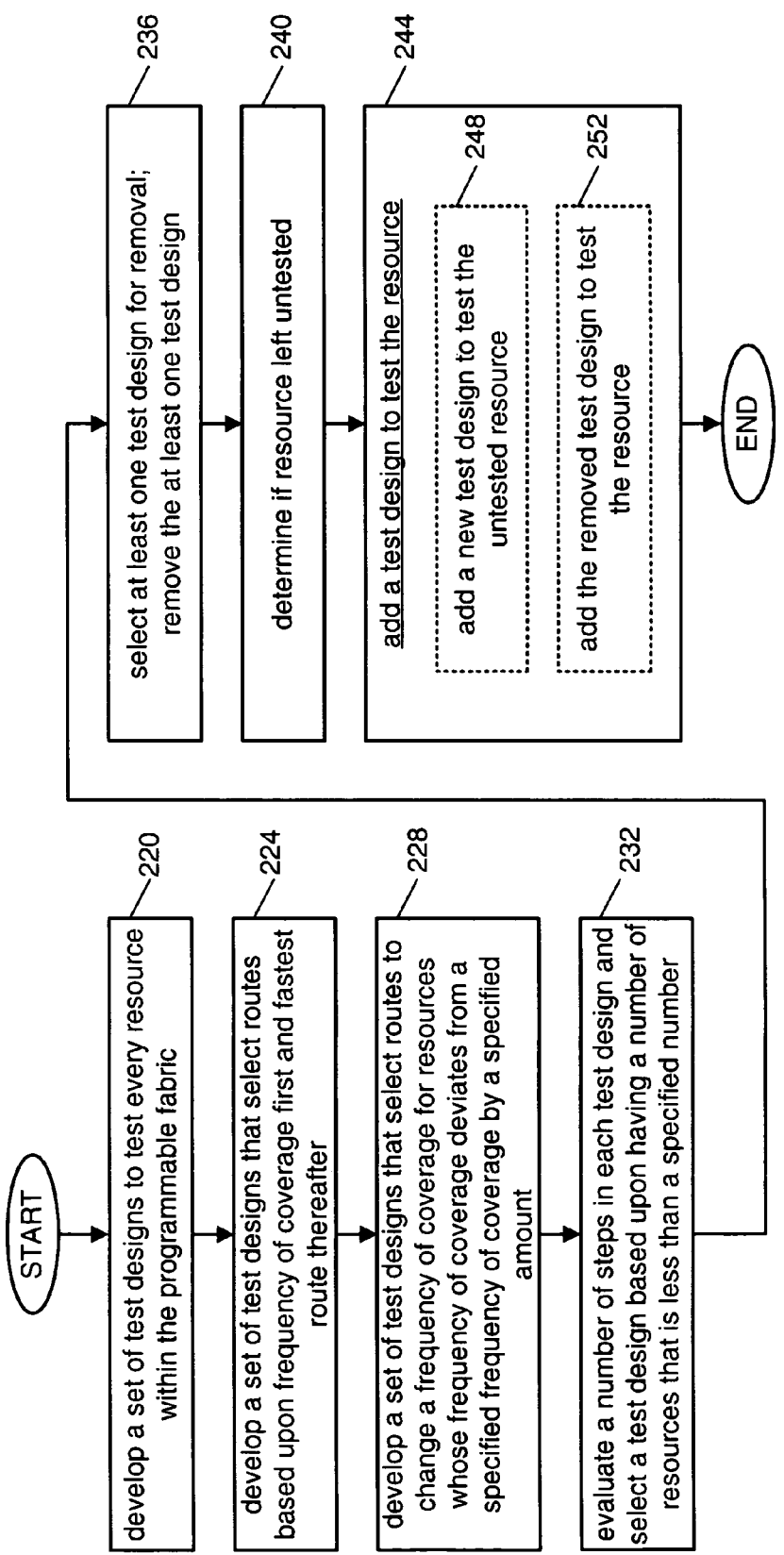
FIG. 9 is a flowchart illustrating a method for developing test designs that test routes and resources within programmable fabric.

FIG. 9 is a flowchart illustrating a method for developing test designs that test routes and resources within programmable fabric. As stated previously, it is desirable to test every resource within the programmable fabric. To this end, one method of the present invention is to develop a set of test designs to test every resource within the programmable fabric (step 220) then reduce the total number of test designs in a manner that will reduce the overall test bit stream programming and test time. To achieve these goals, test designs are developed that select routes based upon frequency of coverage first, and fastest route thereafter (step 224).

A suite of test designs typically includes resources that are tested repeatedly. Some of these test designs can be removed without affecting the resource coverage. The method selects routes to change a frequency of coverage for resources whose frequency of coverage deviates from a specified frequency of coverage by a specified amount (step 228). In one embodiment the frequency of coverage is 10 and the specified amount is five. This step attempts to balance the resource coverage, which increases the probability that test designs can be deleted.

Thereafter, each test design is evaluated for a number of resources tested in each test design. A test design is selected for removal based upon having a number of uniquely tested resources that is less than a specified number (step 232). In one embodiment of the present invention, the specified number is twelve. Once the test designs have been evaluated, the method selects at least one test design for removal and removes the at least one test design (step 236) then determines if any resources are left untested (step 240). If, after removing the test design, at least one resource is left untested, the resource must be covered by another test design (step 244). One option is to add a new test design to test the resource left untested (step 248). This is advantageous since the new test design can be routed to cover the untested resource as well as covering lightly tested resources thereby balancing the resource coverage. A second option available when adding test designs back to the test design suite is to add the removed test design to test the resource (step 252).

Figure 10:
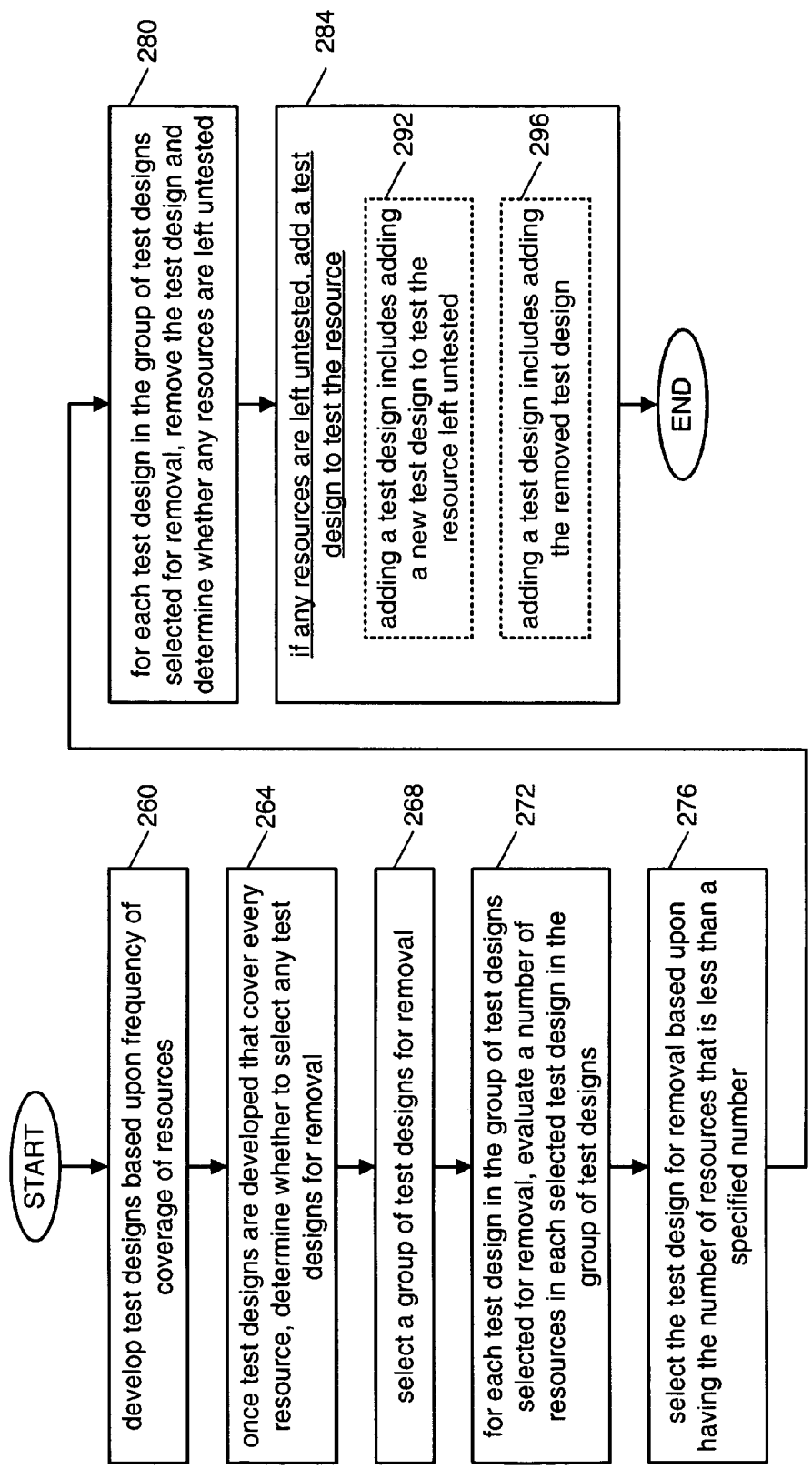
FIG. 10 is a flowchart that illustrates a method for developing test designs that test routes and resources within programmable fabric.

FIG. 10 is a flowchart that illustrates a method for developing test designs that test routes and resources within programmable fabric. The test designs test every resource in the programmable fabric to verify routability and functionality of the fabric. To achieve this goal, the method develops test designs based upon frequency of coverage of resources (step 260). Ideally, test designs attempt to test every resource substantially the same number of times. Some resources will, however, only be tested by a few test designs.

Once test designs are developed that cover every resource, the method determines whether to select any test designs for removal (step 264). This selection may be based on, for example, test designs that only test a small number of resources. Thereafter, the method selects a group of test designs for removal (step 268) and then, for each test design in the group of test designs selected for removal, evaluates a number of resources in each selected test design in the group of test designs (step 272). Thereafter, a test is selected for removal based upon having a number of resources that is less than a specified number (step 276). In one embodiment of the present invention the specified number is twelve.

Each test design in the group of test designs selected for deletion is removed and a determination is made whether any resources are left untested (step 280). The designs in this embodiment may be a specified percentage of a total number of test designs. If any resources are left untested, a test design is added to test the untested resource (step 284). Adding a test design may include adding a new test design to test the resource left untested (step 292) or adding a deleted test design (step 296). Another method according to the embodiments of the present invention includes: 1) removing all designs that meet the criteria established for being removed; 2) determining the complete set of coverage lost by removing all of these designs; and 3) creating new designs to cover what was lost by the removal of these designs. This approach is, in some cases, more efficient since all of the lost coverage from many designs may be picked up in aggregate by one or a few new designs.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A method for developing test designs that test resources in a programmable fabric, comprising:
   developing a suite of test designs to test a set of resources in the programmable fabric;
   selecting at least one test design of the suite of test designs for removal;
   removing the at least one test design;
   for each test design that is removed, determining if a resource of the set of resources is left untested; and
   if a resource of the set of resources is left untested, adding a test design to test the resource.

2. The method of claim 1 wherein adding the test design includes adding the removed at least one test design.

3. The method of claim 1 wherein adding the test design includes adding a new test design to test the resource left untested.

4. The method of claim 1 wherein the step of selecting the at least one test design for removal includes evaluating a number of resources in each test design of the suite of test designs.

5. The method of claim 4 wherein each of the at least one test design is selected for removal based upon having a number of uniquely tested resources that is less than a specified No.

6. The method of claim 5 wherein the specified number is equal to twelve.

7. The method of claim 4 wherein the removed at least one test design is a specified percentage of a total number of test designs in the suite.

8. The method of claim 1 wherein developing the suite of test designs to test a set of resources in the programmable fabric further includes developing test designs that select routes based upon frequency of coverage first and fastest route thereafter.

9. The method of claim 1 wherein developing the suite of test designs to test a set of resources in the programmable fabric further includes developing test designs that select routes to change a frequency of coverage for resources whose frequency of coverage deviates from a specified frequency of coverage by a specified amount.

* * * * *